US009741723B2

(12) United States Patent
Tomoyama (10) Patent No.: US 9,741,723 B2
(45) Date of Patent: Aug. 22, 2017

(54) SEMICONDUCTOR DEVICE HAVING SHALLOW TRENCH ISOLATION STRUCTURE

(71) Applicant: Micron Technology, Inc., Boise, ID (US)

(72) Inventor: Tsuyoshi Tomoyama, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/852,852

(22) Filed: Sep. 14, 2015

(65) Prior Publication Data

US 2016/0233297 A1 Aug. 11, 2016

(30) Foreign Application Priority Data

Feb. 10, 2015 (JP) .................................. 2015-024569

(51) Int. Cl.
*H01L 21/70* (2006.01)
*H01L 21/76* (2006.01)
*H01L 27/108* (2006.01)

(52) U.S. Cl.
CPC .. *H01L 27/10897* (2013.01); *H01L 27/10814* (2013.01)

(58) Field of Classification Search
USPC ....................................................... 257/506
See application file for complete search history.

(56) References Cited

U.S. PATENT DOCUMENTS

| 4,384,347 | A | * | 5/1983 | Nakano | ................. | G11C 5/025 |
|---|---|---|---|---|---|---|
| | | | | | | 257/296 |
| 8,154,102 | B2 | | 4/2012 | Matsuda et al. | | |
| 8,580,649 | B2 | | 11/2013 | Miyahara et al. | | |
| 2009/0140370 | A1 | * | 6/2009 | Jou | ....................... | H01L 23/585 |
| | | | | | | 257/487 |
| 2012/0086084 | A1 | | 4/2012 | Kikuchi | | |
| 2015/0091127 | A1 | * | 4/2015 | Lee | ..................... | H01L 29/0649 |
| | | | | | | 257/506 |
| 2015/0228658 | A1 | * | 8/2015 | Taniguchi | ................ | G11C 8/14 |
| | | | | | | 257/390 |

FOREIGN PATENT DOCUMENTS

| JP | 2010-166026 | 7/2010 |
|---|---|---|
| JP | 2012-099793 | 5/2012 |
| JP | 2012-231007 | 11/2012 |
| JP | 2014-138053 | 7/2014 |

* cited by examiner

*Primary Examiner* — Sitaramarao S Yechuri
(74) *Attorney, Agent, or Firm* — Wells St. John, P.S.

(57) ABSTRACT

A semiconductor device is provided, which prevents a case where the widths of word lines become uneven because of a stress developing at the border between a memory cell area and a peripheral circuit area. The semiconductor device 1 has a semiconductor substrate 2 on which a memory cell area MC defined by a peripheral isolation region 3c. The memory cell area MC has multiple cell active regions k defined by multiple cell isolation regions 3a, 3b. Guard active regions GLa, GLb made of the semiconductor substrate are disposed in the border between the memory cell area MC and the peripheral isolation region 3c to separate the memory cell isolation regions 3a, 3b from the peripheral isolation region 3c.

13 Claims, 5 Drawing Sheets

SEMICONDUCTOR DEVICE HAVING SHALLOW TRENCH ISOLATION STRUCTURE

RELATED PATENT DATA

This application is based upon and claims the benefit of priority from Japanese Patent Application No. 2015-024569 filed on Feb. 10, 2015, the disclosure of which is incorporated herein in its entirely by reference.

TECHNICAL FIELD

The present invention relates to a semiconductor device and particularly to a semiconductor device including a memory cell area and a peripheral circuit area disposed along the periphery of the memory cell area via an isolation region.

BACKGROUND OF THE INVENTION

A semiconductor device, such as DRAM (Dynamic Random Access Memory), includes a memory cell area and a peripheral circuit area disposed along the periphery of the memory cell area. Multiple active regions are arranged into matrix formation in the memory cell area, where the active regions are defined by isolation regions with a relatively small width. Multiple active regions are arranged also in the peripheral circuit area, where the active regions are defined by an isolation region with a relatively large width. The isolation regions in the memory cell area and the isolation region in the peripheral circuit area integrate with each other at the border between the memory cell area and the peripheral circuit area.

The isolation regions are created by forming trenches on a semiconductor substrate and filling the trenches with a dielectric film. Specifically, to form the isolation region with a relatively large width in the peripheral circuit area, a dielectric film formed by HDP (High Density Plasma)-CVD (Chemical Vapor Deposition) with better productivity is usually used. To form the isolation regions with a relatively small width in the memory cell area, however, a flowable thin film formed by flowable CVD, etc., may be used. This is because that the HDP-CVD is so inferior in film-burying performance that narrow trenches of 30 nm or less in width cannot be filled sufficiently with a film by the HDP-CVD. Examples of forming an isolation region using a flowable thin film are disclosed in patent document 1 (Japanese Patent Application Publication No. JPA 2010-166026), patent document 2 (Japanese Patent Application Publication No. JPA 2012-231007), and patent document 3 (Japanese Patent Application Publication No. JPA 2014-138053).

Multiple word lines are formed in the memory cell area. These word lines are formed by, for example, forming word trenches on the semiconductor substrate, covering the inner surface of the word trenches with a gate dielectric film on which a conductive film is deposited, and etching back the conductive film. Hereinafter, word lines formed in such a manner will be referred to as "buried word line". The word lines are arranged such that, for example, two word lines pass through one active region. Patent document 4 (Japanese Patent Application Publication No. JPA 2012-099793) discloses an example in which a plurality of buried word lines is arranged such that two word lines pass through one active region.

DETAILED DESCRIPTION OF EXAMPLE EMBODIMENTS

Preferred embodiments of the present invention will now be described with reference to the accompanying drawings.

Experimental result knowledge obtained through experiments by the inventor will first be described, referring to FIGS. 6 and 7.

Figure 6:
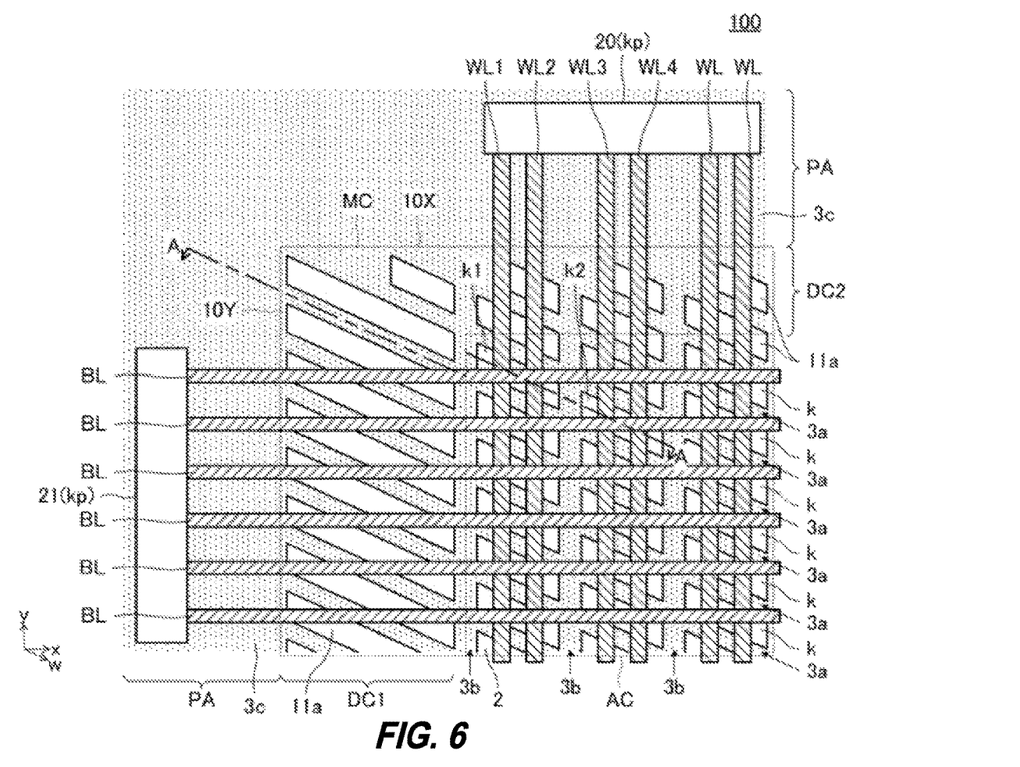
FIG. 6 is a plan view of a layout of the isolation regions 3a to 3c of a semiconductor device 100 according to a related art to the present invention.
Figure 7:
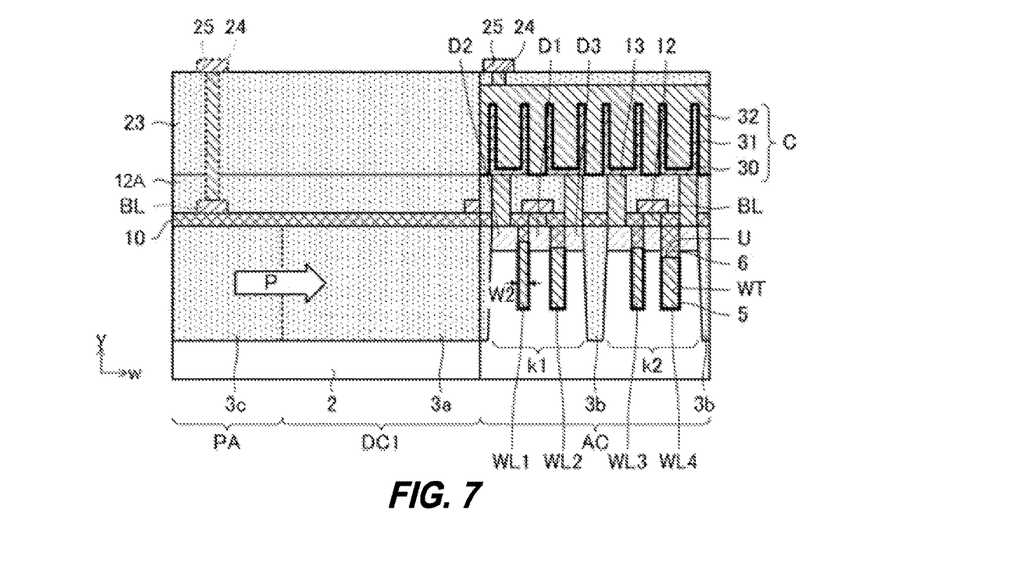
FIG. 7 is a sectional view of the semiconductor device 100 that is taken along an A-A line of FIG. 6.

A semiconductor device 100 the inventor has experimented with is a DRAM, and is configured such that a memory cell area MC and a peripheral circuit area PA are defined on a main surface of a semiconductor substrate 2, as shown in FIGS. 6 and 7.

The memory cell area MC is a rectangular area having a first side 10Y extending in the y direction (first direction) and a second side 10X extending in the x direction (second direction) perpendicular to the y direction. The memory cell area MC includes a rectangular active cell area AC and a dummy cell area encircling the active cell area AC. The dummy cell area is composed of a first dummy cell area DC1 disposed along the first side 10Y and a second dummy cell area DC2 disposed along the second side 10X. The memory cell area MC shown in FIG. 6 is a part of the actual memory cell area. The actual memory cell area extends further rightward and downward in FIG. 6, and therefore dummy cell areas identical with the above dummy cell areas are arranged along the right and lower edges of the actual memory cell area, which are not depicted. The memory cell area MC has a pair of the first sides extending in the first direction and a pair of the second sides extending in the second direction.

The memory cell area MC includes cell first isolation regions 3a and cell second isolation regions 3b that are formed by burying a dielectric film, such as a silicon oxide film, in the semiconductor substrate 2, and multiple cell active regions k (including cell active regions k1 and k2 shown in FIG. 6) each encircled with cell first isolation regions 3a and cell second isolation regions 3b. The cell first isolation regions 3a are so formed as to extend in a w direction tilted against the x direction, while the cell second isolation regions 3b are so formed as to extend in the y direction. Because the cell first isolation regions 3a and cell second isolation regions 3b are formed in such a manner, each cell active region k has a parallelogrammatic plane shape with one pair of opposed sides parallel with the y direction and the other pair of opposed sides parallel with the w direction.

Each cell first isolation region 3a is an isolation region extending in parallel with the direction in which the other pair of opposed sides of the cell active region k extend. Each cell second isolation region 3b is an isolation region extending in parallel with the direction in which the one pair of opposed sides of the cell active region k extend. More specifically, as shown in FIG. 6, the cell first isolation region 3a extends in parallel with the direction in which the long sides of the cell active region k extend, while the cell second isolation region 3b extends in parallel with the direction in which the short sides of the cell active region k extend. The direction in which the short sides extend is equivalent to the first direction in which the first side 10Y of the memory cell area MC extends. It can be said, therefore, that the cell second isolation region 3b extends in parallel with the direction in which the first side 10Y extends. Hence the cell first isolation region 3a and the cell second isolation region 3b are inevitably put in such arrangement that they intersect each other. The cell second isolation region 3b intersects the second side 10X of the memory cell area MC and integrates with a peripheral isolation region 3c. The cell first isolation region 3a intersects at least one of the first side 10Y or the second side 10X of the memory cell area MC and integrates with the peripheral isolation region 3c. The cell active regions k are arranged into a matrix consisting of rows of cell active regions k along the x direction and columns of the same along the y direction. Each cell active region k includes two memory cells of the DRAM. In the following description, the cell first isolation region 3a and cell second isolation region 3b are simply referred to as cell isolation regions 3a and 3b when mentioning respective cell isolation regions separately is unnecessary.

The first dummy cell area DC1 includes multiple dummy cell active regions 11a arranged along the first side 10Y. These dummy cell active regions 11a in the first dummy cell area DC1 are isolated from each other by the cell first isolation regions 3a extending from the active cell area AC into the first dummy cell area DC1, and are isolated from the cell active regions k in the active cell area AC by the cell second isolation region 3b. Similarly, the second dummy cell area DC2 includes multiple dummy cell active regions 11a arranged along the second side 10X. These dummy cell active regions 11a in the second dummy cell area DC2 are isolated from each other by the cell first isolation regions 3a and cell second isolation regions 3b that extend from the active cell area AC into the second dummy cell area DC2, and are isolated from the cell active regions k in the active cell area AC by the cell isolation regions 3a and 3b. The dummy cell active regions 11a include no memory cell and therefore make no contribution to the operation of the semiconductor device 100 serving as the DRAM.

The peripheral circuit area PA is an area disposed along the periphery of the memory cell area MC, and is composed of the peripheral isolation region 3c formed by burying a dielectric film, such as a silicon oxide film, in the semiconductor substrate 2 and one or more peripheral active regions kp each encircled with the peripheral isolation region 3c. In each peripheral active region kp, a peripheral circuit, such as a word driver 20 and sense amplifier 21, is disposed, as shown in FIG. 6. FIG. 6 shows only two peripheral active regions kp, but in an actual case, more than two peripheral active regions kp are included in the peripheral circuit area PA. The memory cell area MC is defined by the peripheral isolation region 3c. At the border between the memory cell area MC and the peripheral isolation region 3c (the border including the pair of the first sides 10Y and the pair of the second sides 10X), the peripheral isolation region 3c integrates with the cell isolation regions 3a and 3b.

Multiple word lines WL (including word lines WL1 to WL4 shown in FIG. 6) are connected to the word driver 20. Each word line WL is so formed as to extend in the y direction from the peripheral circuit area PA into the memory cell area MC, in which the word line WL intersects each of the cell active regions k lined up in the y direction. The word lines WL are arranged such that two word lines WL pass through one cell active region k.

As shown in FIG. 7, each word line WL is a buried word line made of a conductive film filling the lower part of a word trench WT via a gate insulating film 5. The upper part of the word trench WT is filled with a cap dielectric film 6 made of a silicon nitride film, which cap dielectric film 6 ensures that the word line WL is insulated from various lines (including a bit line that will be described later) formed on an upper layer.

Paying attention to one cell active region k reveals that a diffusion layer D1 is located between the word lines WL corresponding to the cell active region k. A diffusion layer D2 is located opposite to the diffusion layer D1 across one word line WL1 (that is, located between one word line WL1 and one cell second isolation region 3b), and a diffusion layer D3 is located opposite to the diffusion layer D1 across the other word line WL2 (that is, located between the other word line WL2 and another cell second isolation region 3b). Each of the diffusion layers D1 to D3 is an impurity diffusion layer formed by implanting ions of such impurity as phosphorus into the surface of the semiconductor device 2. The diffusion layers D1 and D2 and the word line WL1 located there-between make up one cell transistor, and the diffusion layers D1 and D3 and the word line WL2 located there-between make up another cell transistor.

Multiple bit lines BL are connected to the sense amplifier 21 (FIG. 6). Each bit line BL is so formed as to extend in the x direction from the peripheral circuit area PA into the memory cell area MC, in which the bit line BL intersects each of the cell active regions k lined up in the x direction. The bit lines BL are arranged such that one bit line BL passes through one cell active region k.

As shown in FIG. 7, each bit line BL is formed on the surface of an interlayer dielectric film 10 made of a silicon nitride film covering the surface of the semiconductor substrate 2, and is connected to the diffusion layer D1 in the corresponding cell active region k via a bit line contact plug 12 penetrating the interlayer dielectric film 10. Actually, each bit line BL has its upper surface and side faces covered with the silicon nitride film, which ensures that the bit line BL is insulated from a capacitor contact plug 13 and a cell capacitor C, which will be described later. This silicon nitride film is not depicted in FIG. 7. An end of each bit line BL in the peripheral circuit area PA is connected to an upper conductive line 25 formed on the upper surface of an interlayer dielectric film 23, via a contact plug 24 penetrating interlayer dielectric films 12A and 23, which will be described later. The bit line BL and the sense amplifier 21 are interconnected via the upper conductive line 25.

The upper surface of the interlayer dielectric film 10 is overlaid with the interlayer dielectric film 12A made of a silicon oxide film. On the upper surface of the interlayer dielectric film 12A, multiple cell capacitors C are formed, each of which is composed of a bottom electrode 30, a capacitor dielectric film 31, and an upper electrode 32. A silicon nitride film serving as an etching stopper is actually formed on the upper surface of the interlayer dielectric film 12A but is not depicted in FIG. 7. One cell capacitor C is provided for one cell transistor corresponding thereto. The bottom electrode 30 is an independent electrode belonging to each cell capacitor C, and is connected to the corresponding diffusion layers D2 and D3 via a capacitor contact plug 13 penetrating the interlayer dielectric films 10 and 12A. The upper electrode 32 is shared by the multiple cell capacitors C, and is connected to the upper conductive line 25 formed on the upper surface of the interlayer dielectric film 23, via a contact plug 24 penetrating interlayer dielectric film 23.

When the advanced stage of microfabrication of the semiconductor device reduces the feature size (minimum processing size) of the semiconductor device to 30 nm or smaller, the width of the cell isolation regions 3a and 3b is reduced to 30 nm or smaller. In such a case, to form the cell isolation regions 3a and 3b with better film-burying performance, using the above flowable thin film as a dielectric film to be buried in trenches is preferable.

Under these circumstances, when the cell isolation regions 3a and 3b are formed from the flowable thin film, the peripheral isolation region 3c is also formed by the flowable thin film at same time. In this case, the cell isolation regions 3a, 3b and the peripheral isolation region 3c having a larger area than the cell isolation regions 3a, 3b are different in shape and volume from each other. As a result, in the semiconductor device 100, a large stress P as shown in FIG. 7 develops at the border between the cell isolation regions 3a, 3b and the peripheral isolation region 3c. For formation of the flowable thin film, chemical vapor deposition using a silazane material containing an NH group is employed to give the film flowability. The resulting film, however, shows extremely inferior quality right after the film formation process. To remedy this flaw, the formed film must be subjected to oxidization heat treatment. This oxidization heat treatment eliminates the NH group, thus causing a shrinkage stress, the size of which depends on the volume of film, which is a known fact. Such a stress P affects the shape of the cell active region k in the memory cell area MC. Specifically, as shown in FIG. 7, the stress P makes the widths W2 of the word trenches WT uneven. As a result, the rate of etching back the conductive film making up the word line WL becomes different at each word line WL, so that the positions of respective upper surfaces U of the word lines WL become different from each other. This variation in the positions of respective upper surfaces U leads to a variation in the characteristics of the cell transistors, thus hampering the stable operation of the semiconductor device 100. In an extreme case, the variation in the positions of respective upper surfaces U causes a short circuit between the word line WL and the bit line BL. The extent of reduction of the width W2 by the stress P tends to be larger in a cell active region k located closer to the edge of the memory cell area MC and to be smaller in a cell active region k located deeper inside the memory cell area MC.

A semiconductor device 1 according to an embodiment of the present invention that is provided based on acquired knowledge of the inventor will hereinafter be described in detail, referring to FIGS. 1 to 3. The semiconductor device 1 of the present invention suppresses the above variation in the positions of respective upper surfaces U of the word lines WL that is caused by the stress P, thereby realizes the stable operation of the semiconductor device 1.

The semiconductor device 1 is different from the semiconductor device 100 in the shape of active regions formed in the memory cell area MC, and is identical with the semiconductor device 100 in other aspects. The same constituent elements as those included in the semiconductor device 100 will therefore be denoted by the same reference numerals and omitted in further description. In the following description, attention is directed to the difference between the semiconductor device 1 and the semiconductor device 100.

Figure 1:
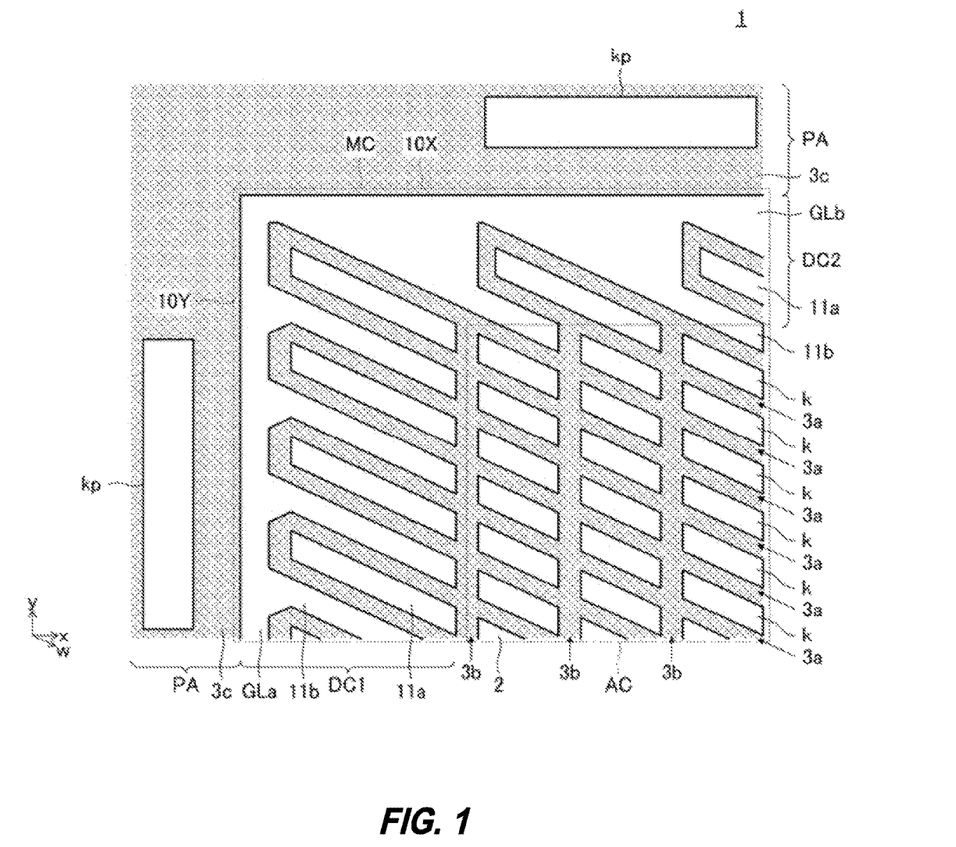
FIG. 1 is a plan view of a layout of isolation regions 3a to 3c of a semiconductor device 1 according to a preferable first embodiment of the present invention.
Figure 2:
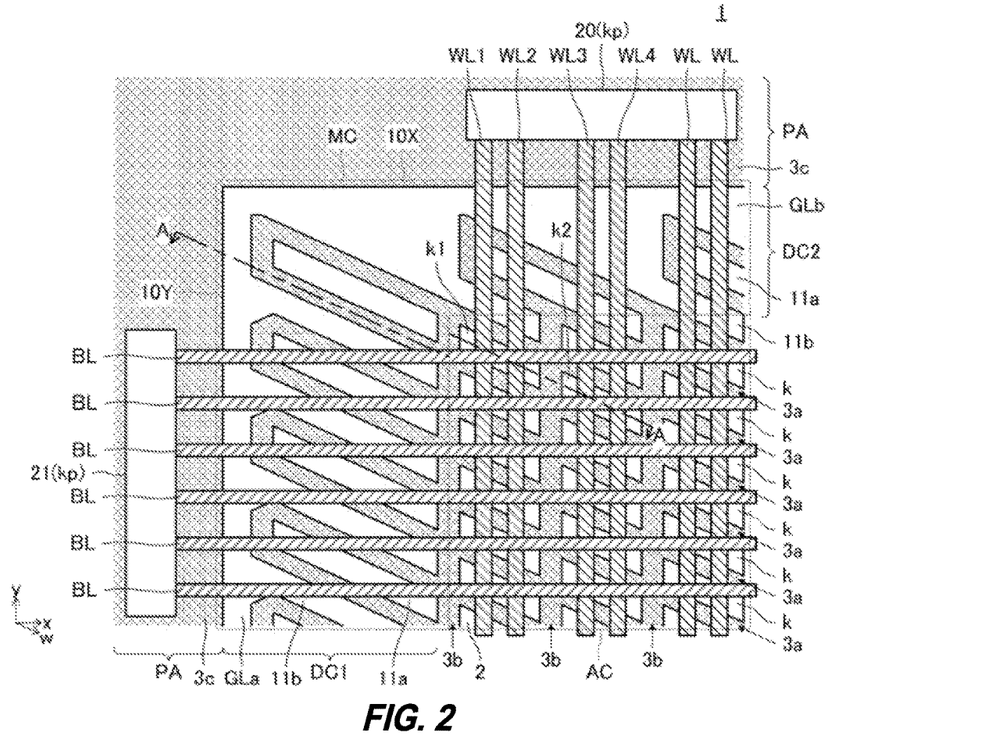
FIG. 2 is a plan view created by superposing word lines WL and bit lines BL on the plan view of FIG. 1.
Figure 3:
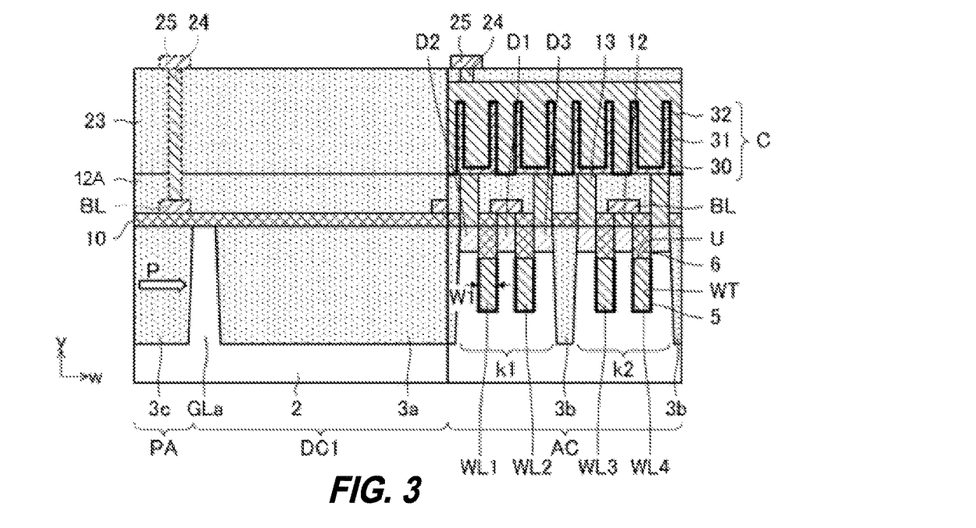
FIG. 3 is a sectional view of the semiconductor device 1 that is taken along an A-A line of FIG. 2.

As shown in FIGS. 1 and 2, the memory cell area MC of the semiconductor device 1 includes guard active regions GLa and GLb. These guard active regions GLa and GLb are formed from the semiconductor substrate 2 (diffusion layer) and are arranged such that a pair of first guard active regions GLa extends along the pair of first sides 10Y while a pair of second guard active regions GLb extends along the pair of second sides 10X. The first guard active region GLa is thus disposed between the first dummy cell area DC1 and the peripheral isolation region 3c (isolation area) while the second guard active region GLb is disposed between the second dummy cell area DC2 and the peripheral isolation region 3c. In another aspect, the first and second guard active regions GLa, GLb are disposed in the border between the memory cell area MC and the peripheral isolation region 3c, respectively. The first guard active region GLa and the second guard active region GLb join together at their ends. In the following description, the first guard active region GLa and second guard active region GLb are simply referred to as guard active regions GLa and GLb when mentioning respective guard active regions separately is unnecessary.

The same guard active regions (not depicted) are arranged along the other two sides of the memory cell area MC. Hence the outer periphery of the memory cell area MC is completely encircled with the guard active regions arranged along the other two sides and with the guard active regions GLa and GLb. According to this embodiment, the entire outer periphery of the memory cell area MC is encircled with those guard active regions. However, the guard active regions may be arranged along only the two opposed sides (one pair of the opposing sides), which will be described later as a configuration according to a third embodiment. It is preferable that the guard active regions GLa and GLb be formed by a process such that when trenches to be filled with the dielectric film making up the cell isolation regions 3a, 3b and peripheral isolation region 3c are formed on the semiconductor substrate 2, no trench is formed in a region for forming the guard active regions GLa and GLb.

The first dummy cell area DC1 disposed adjacent to and along the first side 10Y includes multiple dummy cell active regions 11, which are composed of the first dummy cell active regions 11a and second dummy cell active regions 11b that are arranged alternately in the first direction at equal intervals. Each first dummy cell active region 11a has its entire periphery encircled with the cell isolation regions, but each second dummy cell active region 11b has its part counter to the first side 10Y connected to the first guard active region GLa. In other words, a part of the second dummy cell active region 11b is formed integrally with the first guard active region GLa. More specifically, as shown in FIG. 1, the second dummy cell active regions 11b between which the first dummy cell active regions 11a are sandwiched one by one, respectively, are formed integrally with the first guard active region GLa. In this case, because the second dummy cell active regions 11b make up a part of the first guard active region GLa, the first guard active region GLa is structured into a comb shape in a plan view.

Similarly, the second dummy cell area DC2 disposed adjacent to and along the second side 10X includes multiple dummy cell active regions 11, which are composed of the first dummy cell active regions 11a and second dummy cell active regions 11b that are arranged alternately in the second direction at equal intervals. Each first dummy cell active region 11a has its entire periphery encircled with the cell isolation regions, but each second dummy cell active region 11b has its part closer to the second side 10X connected to the second guard active region GLb. In other words, a part of the second dummy cell active region 11b is formed integrally with the second guard active region GLb. More specifically, as shown in FIG. 1, the second dummy cell active regions 11b between which the first dummy cell active regions 11a are sandwiched one by one, respectively, are formed integrally with the second guard active region GLb. In this case, because the second dummy cell active regions 11b make up a part of the second guard active region GLb, the second guard active region GLb is structured into a comb shape in a plan view.

As described above, according to the semiconductor device 1 of this embodiment, the peripheral isolation region 3c is completely isolated from the cell isolation regions 3a and 3b by the guard active regions including the guard active regions GLa and GLb. As a result, such a stress as developed in the case of the semiconductor device 100 does not develop at the border between the peripheral isolation region 3c and the cell isolation regions 3a and 3b. The semiconductor device 1, therefore, prevents a case where the widths W1 of the word trenches WT become uneven (see FIG. 3). This suppresses a variation in the positions of upper surfaces U of the word lines WL, thus realizing the stable operation of the semiconductor device 1, and also suppresses the occurrence of a short circuit between the word line WL and the bit line BL.

Figure 4:
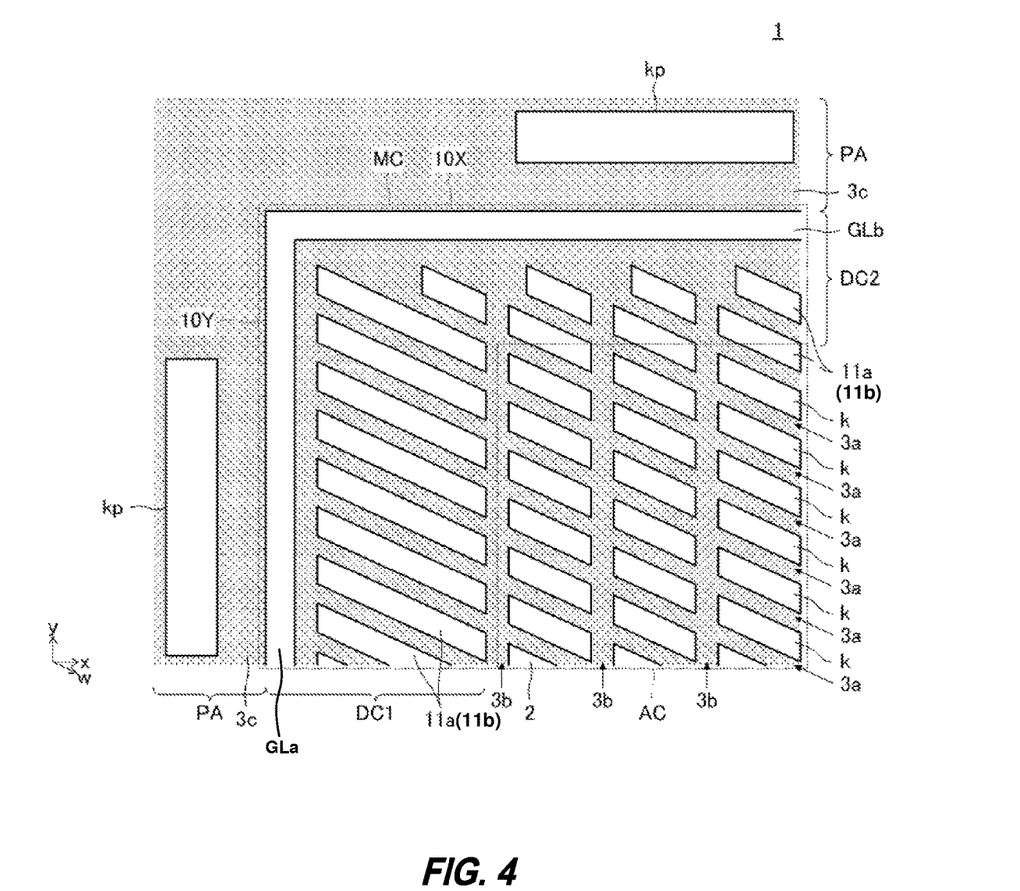
FIG. 4 is a plan view of a layout of the isolation regions 3a to 3c of the semiconductor device 1 according to a preferable second embodiment of the present invention.

The semiconductor device 1 according to a second embodiment of the present invention will then be described, referring to FIG. 4. The semiconductor device 1 of the second embodiment is different from the semiconductor device 1 of the first embodiment in that the guard active regions (including the guard active regions GLa and GLb) encircling the outer periphery of the memory cell area MC are not connected to the first and second dummy cell active regions 11a and 11b, and is identical with the semiconductor device 1 of the first embodiment in other aspects. According to the second embodiment, both of the first dummy cell active regions 11a and the second dummy cell active regions 11b are encircled with the cell isolation regions. The first guard active region GLa is provided as a linear guard active region extending along the first side 10Y of the memory cell area MC. The second guard active region GLb is provided as a linear guard active region extending along the second side 10X of the memory cell area MC, and is connected to the first guard active region GLa at each corner of the memory cell area MC. According to such a configuration, the case where the widths W1 of the word trenches WT become uneven (see FIG. 3) is prevented in the same manner as in the first embodiment. According to the second embodiment, the entire outer periphery of the memory cell area MC is encircled with those guard active regions. However, the guard active regions may be arranged along only the two opposed sides, which will be described later as a configuration according to a third embodiment.

Figure 5:
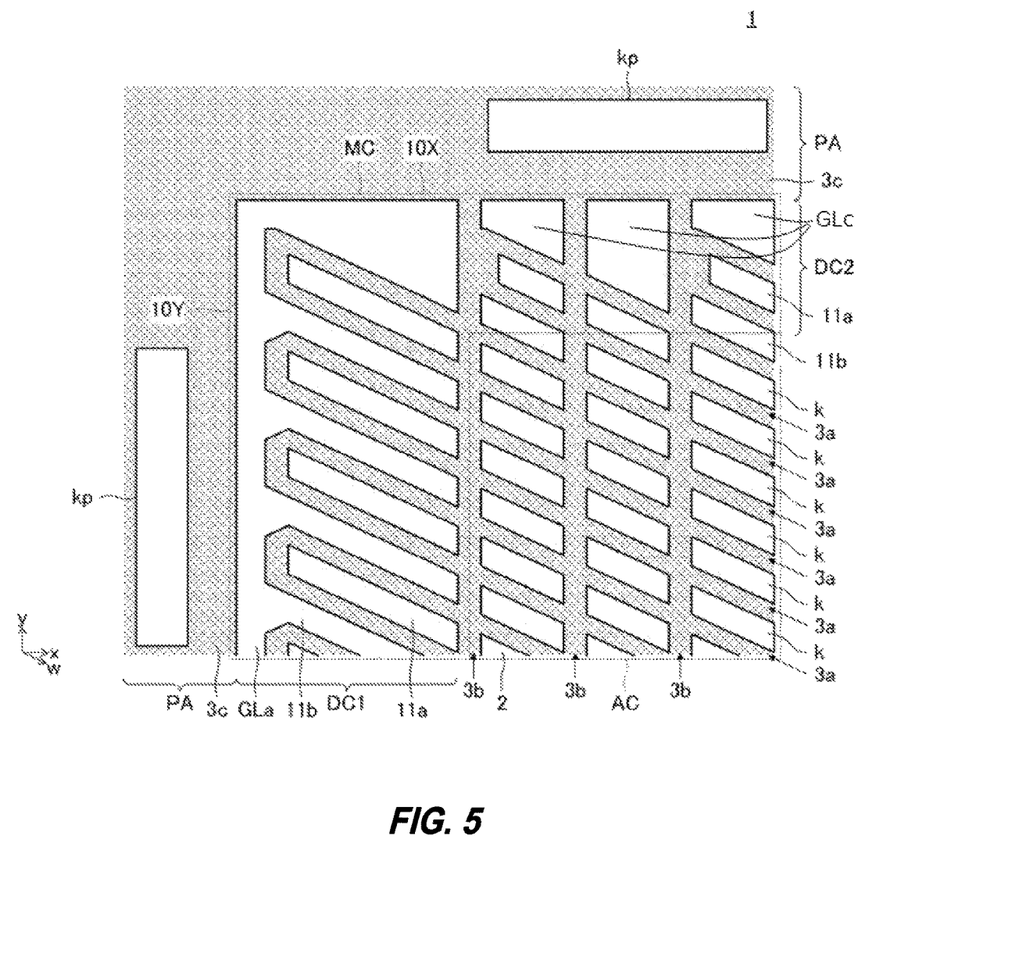
FIG. 5 is a plan view of a layout of the isolation regions 3a to 3c of the semiconductor device 1 according to a preferable third embodiment of the present invention.

The semiconductor device 1 according to a third embodiment of the present invention will now be described, referring to FIG. 5. The semiconductor device 1 of the third embodiment is different from the semiconductor device 1 of the first embodiment in that the cell second isolation regions 3b are extended to the edge of the memory cell area MC and consequently the second guard active region GLb is divided by the cell second isolation regions 3b. In other aspects, the semiconductor device 1 of the third embodiment is identical with the semiconductor device 1 of the first embodiment.

According to the third embodiment, because the second guard active region GLb is divided by the cell second isolation regions 3b, the peripheral isolation region 3c integrates with the cell second isolation regions 3b at the border corresponding to the second side 10X. Thereby, the second guard region GLb in this embodiment has a plurality of sub-second guard active regions GLc arranged separately from each other. The guard active region formed along the side opposite to the second side 10X (which guard active region is not depicted) is also divided by the cell second isolation regions 3b. As a result, a stress P as shown in FIG. 7 is produced in the y direction. However, because the word trenches WT are so formed as to extend in the y direction, the stress P acting in the y direction exerts little effect on the width W1 of the word trenches WT (see FIG. 3). This leads to a conclusion that when linearly extending buried lines are arranged in the memory cell area MC, the guard active regions may be disposed along at least opposing sides (one pair of the opposing sides) of memory cell area MC that are parallel with the direction of extension of the buried lines. For example, in the case of FIG. 2 where the buried word lines WL extending linearly in the y direction (first direction) are arranged in the memory cell area MC, the first guard active region GLa is disposed at least along the first side 10Y of the memory cell area MC and along the side opposite to the first side 10Y, the first side 10Y and opposite side being parallel with the first direction in which the buried word lines WL extend. Hence, according to the third embodiment, the case where the widths W1 of the word trenches WT become uneven is prevented, as in the first embodiment.

A configuration in which the bit lines BL are buried in spaces between the upper surfaces of the buried word lines WL and the upper surface of the semiconductor substrate 2 has been studied in recent years. In such a case, to prevent the unevenness of the widths of the bit trenches to be filled with the conductive film making up the bit lines BL, the outer periphery of the memory cell area MC should preferably be encircled completely with the guard lines in the same manner as in the first and second embodiments.

The preferred embodiments of the present invention have been described above. The present invention is not limited to the above embodiments and may be modified into various applications on the condition that the modification does not deviate from the substance of the present invention. Obviously, the modified applications are also included in the scope of the invention.

For example, the above embodiments are described as examples in which the cell active regions k are arranged into a matrix formation. The present invention is, however, applied preferably also to a semiconductor device in which the cell active regions k are arranged into a different formation. The present invention is applied not only to the DRAM but also to, for example, a ReRAM (resistance Random Access Memory) using a resistance-variable element as a memory element and to a PRAM (Phase Change Random Access Memory) using a phase-variable element as a memory element.

The invention claimed is:
1. An apparatus comprising:
an active cell area including a plurality of first active regions isolated from each other, a plurality of word lines extending in a first direction substantially parallel to each other and a plurality of bit lines extending in a second direction substantially parallel to each other, the second direction crossing the first direction;
a dummy cell area provided outside the active cell area, the dummy cell area including a plurality of second active regions arranged in a column along the first direction and isolated from each other;
an isolation area provided outside the dummy cell area; and
a guard active region intervening between the isolation area and the dummy cell area, the guard active region comprising a first guard active region extending longitudinally along the first direction, the first guard active region having a comb shape comprising a continuous straight-linear active region comb shaft extending along the first direction and spaced active region comb teeth angling from the comb shaft away from the isolation area, the spaced active region comb teeth individually alternating with individual of the dummy second active regions in the column along the first direction, the individual comb teeth along the first direction being between every immediately-adjacent of the individual dummy second active regions with no additional active region being between immediately-adjacent of the individual comb teeth.

2. The apparatus of claim 1 wherein the guard active region further comprises a second guard active region extending along the second direction.

3. The apparatus of claim 2 wherein the first active regions are arranged in columns along the first direction, the second guard active region extending longitudinally continuously along the second direction along multiple of the columns of the first active regions.

4. The apparatus of claim 2 wherein the first active regions are arranged in columns along the first direction, the second guard active region extending longitudinally discontinuously along the second direction.

5. The apparatus of claim 1 wherein the spaced active region comb teeth angle from the comb shaft non-perpendicularly.

6. The apparatus of claim 1 wherein the first active regions are arranged in columns along the first direction, the guard active region further comprises a second guard active region extending along the second direction, the second guard active region extending longitudinally discontinuously along the second direction and comprises spaced second guard active regions that are individually aligned with one of first active region columns.

7. The apparatus of claim 6 wherein the spaced second guard active regions are individually of trapezoidal shape in horizontal cross section.

8. An apparatus comprising:
an active cell area including a plurality of first active regions isolated from each other, a plurality of word lines extending in a first direction substantially parallel to each other and a plurality of bit lines extending in a second direction substantially parallel to each other, the second direction crossing the first direction;
a dummy cell area provided outside the active cell area, the dummy cell area including a plurality of second active regions arranged in a column along the first direction and isolated from each other;
an isolation area provided outside the dummy cell area;
a guard active region intervening between the isolation area and the dummy cell area, the guard active region comprising a first guard active region extending longitudinally along the first direction, the first guard active region having a comb shape comprising a continuous straight-linear active region comb shaft extending along the first direction and spaced active region comb teeth angling from the comb shaft away from the isolation area;
the guard active region further comprises a second guard active region extending along the second direction
the first active regions are arranged in columns along the first direction, the second guard active region extending longitudinally discontinuously along the second direction along multiple of the columns of the first active regions; and
the discontinuously-extending second guard active region comprises spaced second guard active regions that are individually aligned with one of first active region columns.

9. The apparatus of claim 8 wherein the spaced second guard active regions are individually of trapezoidal shape in horizontal cross section.

10. An apparatus comprising:
an active cell area including a plurality of first active regions isolated from each other, a plurality of word lines extending in a first direction substantially parallel to each other and a plurality of bit lines extending in a second direction substantially parallel to each other, the second direction crossing the first direction;
a dummy cell area provided outside the active cell area, the dummy cell area including a plurality of second active regions arranged in a column along the first direction and isolated from each other;
an isolation area provided outside the dummy cell area;
a guard active region intervening between the isolation area and the dummy cell area, the guard active region comprising a first guard active region extending longitudinally along the first direction, the first guard active region having a comb shape comprising a continuous straight-linear active region comb shaft extending along the first direction and spaced active region comb teeth angling from the comb shaft away from the isolation area;
the guard active region further comprises a second guard active region extending along the second direction
the first active regions are arranged in columns along the first direction, the second guard active region extending longitudinally discontinuously along the second direction along multiple of the columns of the first active regions; and
the discontinuously-extending second guard active region comprises spaced second guard active regions that are individually of trapezoidal shape in horizontal cross section.

11. An apparatus comprising:
an active cell area including a plurality of first active regions isolated from each other, a plurality of word lines extending in a first direction substantially parallel to each other and a plurality of bit lines extending in a second direction substantially parallel to each other, the second direction crossing the first direction;
a dummy cell area provided outside the active cell area, the dummy cell area including a plurality of second active regions arranged in a column along the first direction and isolated from each other;
an isolation area provided outside the dummy cell area;
a guard active region intervening between the isolation area and the dummy cell area, the guard active region comprising a first guard active region extending longitudinally continuously along the first direction and a second guard active region extending longitudinally discontinuously along the second direction, the discontinuously-extending second guard active region comprising spaced second guard active regions; and the spaced second guard active regions are individually of trapezoidal shape in horizontal cross section.

12. An apparatus comprising:

an active cell area including a plurality of first active regions isolated from each other, a plurality of word lines extending in a first direction substantially parallel to each other and a plurality of bit lines extending in a second direction substantially parallel to each other, the second direction crossing the first direction;

a dummy cell area provided outside the active cell area, the dummy cell area including a plurality of second active regions arranged in a column along the first direction and isolated from each other;

an isolation area provided outside the dummy cell area;

a guard active region intervening between the isolation area and the dummy cell area, the guard active region comprising a first guard active region extending longitudinally continuously along the first direction and a second guard active region extending longitudinally discontinuously along the second direction, the discontinuously-extending second guard active region comprising spaced second guard active regions; and the first active regions are arranged in columns along the first direction, the spaced second guard active regions being individually aligned with one of first active region columns.

13. The apparatus of claim 12 wherein the spaced second guard active regions are individually of trapezoidal shape in horizontal cross section.

* * * * *